United States Patent [19]

Scholz

[11] Patent Number: 4,752,960
[45] Date of Patent: Jun. 21, 1988

[54] AUDIO PROCESSING CIRCUIT

[75] Inventor: Donald T. Scholz, 13 Rich Valley Rd., Wayland, Mass. 01778

[73] Assignee: D. T., Trustee of DTS Patent Trust Scholz, Wayland, Mass.

[21] Appl. No.: 877,224

[22] Filed: Jun. 20, 1986

[51] Int. Cl.$^4$ .............................. H03G 3/00
[52] U.S. Cl. .......................... 381/61; 381/102
[58] Field of Search ............. 381/62, 98, 61, 101, 381/102; 84/1.19, 1.24, DIG. 1.16; 455/235, 245, 267

[56] References Cited

U.S. PATENT DOCUMENTS 3,973,461  8/1976  Jahns .................... 84/1.24
4,286,492  9/1981  Claret ................... 84/1.19

*Primary Examiner*—Forester W. Isen
*Attorney, Agent, or Firm*—Wolf, Greenfield & Sacks

[57] ABSTRACT

An audio processing circuit that is adapted for operation in a partial distortion mode of operation particularly when transitioning from partial distortion to clean signal operation and including a gain control circuit for sensing the level of the audio signal to control gain so as to increase output signal gain as the volume control is decreased in volume. The circuit also includes a sensing circuit for sensing the audio level to boost high end signal content as the volume control is decreased so as to maintain high end or treble signal content at low volume.

35 Claims, 3 Drawing Sheets

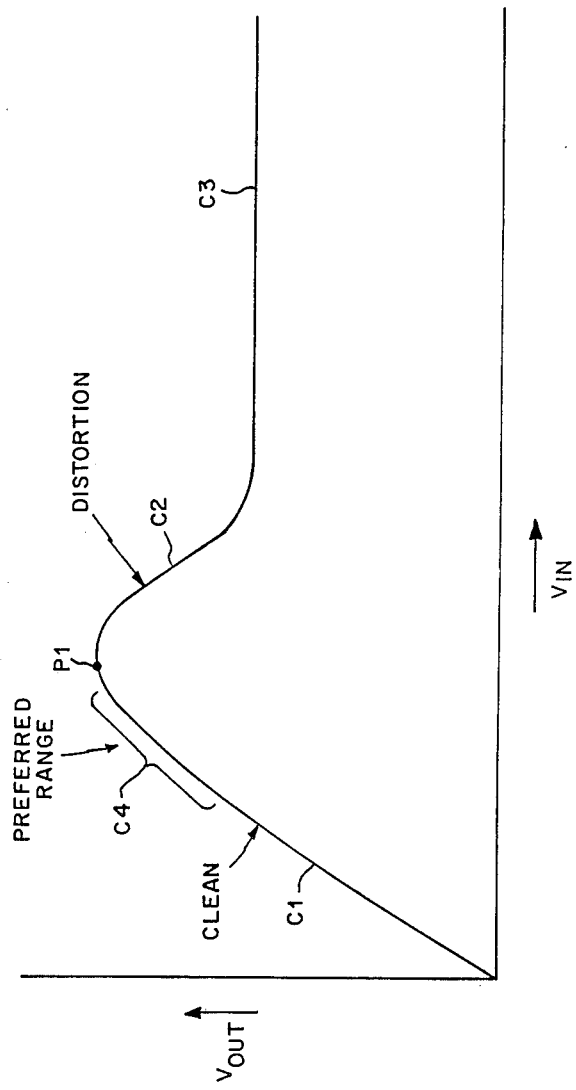

AUDIO PROCESSING CIRCUIT

BACKGROUND OF THE INVENTION

1. Field of the Invention

The present invention relates in general to an audio processing circuit and pertains, more particularly, to a circuit that is adapted for automatic operation in a partial distortion mode of operation. Even more particularly, the invention relates to an audio processing circuit that enables transition from distortion operation to a bright clean audio sound without losing output volume or treble if the instrument volume is turned down.

The principles of the present invention are described herein primarily in connection with the amplification and processing of audio signals from a guitar-type instrument. However, it is understood that the principles of the invention may also be applied in connection with the detection of audio signals from other types of musical instruments.

2. Background Discussion

An audio processing circuit of the general type described herein is disclosed in U.S. Pat. No. 4,584,700. Such a device includes circuitry for providing guitar sounds from very cleans sounds to very distorted sounds. In this connection the device includes a mode selector which basically divides the spectrum of guitar sounds into multiple catagories. These catagories include a distortion mode, a partial distortion mode referred to herein as an "edge" mode, and one or more clean sound modes.

When playing in the partial distortion or "edge" mode of operation the musician may want to turn the volume down to provide a cleaner and less distorted signal. However, with existing systems this creates a number of problems. First, there is a loss of volume that is undesired. Second, as one turns down the volume there is a tendency to lose high end frequencies. This occurs due to the interaction of the volume potentiometer with the pickup device.

Accordingly, it is an object of the present invention to provide an improved audio processing circuit and one which in particular provides, in a partial distortion mode of operation, means for providing a compensating boost in output volume as the volume potentiometer is turned down.

Another object of the present invention is to provide an improved audio processing circuit in which, in said partial distortion mode of operation, the high end frequencies are boosted at low volume settings.

A further object of the present invention is to provide an improved audio processing circuit that allows one to change from at least a partially distorted sound to a clean sound simply by adjusting the instrument volume control. This operation is unlike typical guitar/amplifier responses in which volume and treble usually disappear as the volume knob is turned down.

SUMMARY OF THE INVENTION

To accomplish the foregoing and other objects, features and advantages of the invention there is provided an audio processing circuit that comprises an input terminal for receiving an input audio signal and a distortion section which couples from the input terminal for providing varying amounts of distortion in the audio signal depending on the mode of operation. The present invention is in particular concerned with providing an automatic detection circuit for detecting a transition from a partial distortion mode of operation to a clean signal mode of operation enabling the operation to continue without loss of volume and without loss of high end signal content. In this regard there is provided a gain control means that couples from the distortion section of the circuit and includes means for sensing the level of the audio signal to control gain so as to increase signal gain as the volume means is decreased in volume. The other part of the circuit includes a means for sensing audio signal level to boost high end signal content as the volume control means is decreased in volume so as to maintain high end or treble signal content particularly at decreased volume.

BRIEF DESCRIPTION OF THE DRAWINGS

Numerous others objects, feature and advantages of the invention should now become apparent upon a reading of the following detailed description taken in conjunction with the accompanying drawings, in which:

FIG. 2 illustrates a voltage transfer function for the circuit of this invention.

DETAILED DESCRIPTION

Figure 1A:
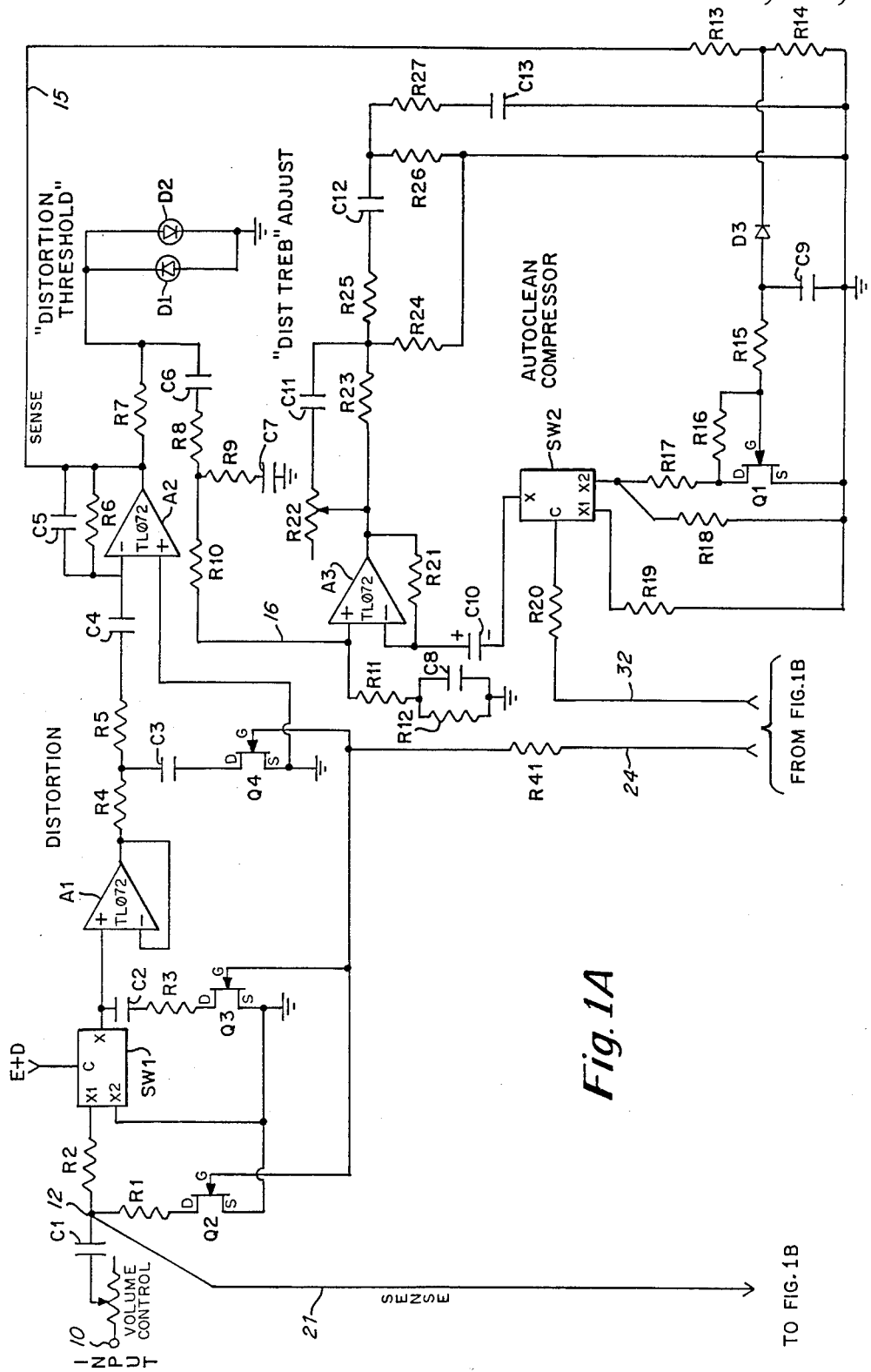
FIGS. 1A–1B illustrate a preferred circuit embodiment of the present invention.

The circuit of the present invention is part of an overall audio processing device adapted specifically for use with guitars. Described herein is in particular a circuit for providing automatic clean signal processing in a partial distortion mode of operation. In the overall audio system, as indicated previously, there are different modes of operation including a full distortion mode of operation, a partial distortion mode of operation and a substantially clean signal mode of operation. The automatic clean circuit of the present invention allows one to change from a distorted sound to a clean sound simply by adjusting the guitar volume knob. Unlike typical guitar/amplifier responses, volume and treble do not disappear as one turns down the volume knob.

The automatic clean circuit is preferably adapted for operation only in a partial distortion or "edge" mode of operation. For loud signals (with the guitar volume knob turned up) the signals are basically unaltered. However, for softer signals (guitar volume knob turned down) the treble and volume are automatically boosted to restore losses that are inherent whenever guitar volume is reduced. The automatic clean feature operates when the gain boost is on, but the clean sound has slightly more mid-range.

In the "edge" mode of operation this automatic compensation circuit of the invention may be considered as being separated into two circuit functions. First, the volume is boosted as the input volume decreases, particularly at the transition from at least partial distortion into no distortion. Second, the high end signals are boosted only at low volume and this is carried out by a second part of the circuit.

Reference is now made to the drawings that illustrate an input audio signal at the input terminal 10, the content of which is to be controlled in accordance with the circuit of the present invention. The input at terminal 10 couples to a filter that provides some degree of low frequency roll-off. This filter includes a capacitor C1 and R1. The output of the filter couples by way of resistor R2 to the electronic switch SW1. The switch SW1 is controlled by input signals indicating that the signal from the resistor R2 is coupled to the output of the switch in either the edge or distortion mode of operation.

At the output of the electronic switch SW1 there is provided a further filter that comprises the capacitor C2 and resistor R3. This filter provides for roll-off at the high end. The output from this filter couples to an operational amplifier A1 and from there to a further filter that provides for additional high end roll-off. This is comprised of resistor R4 and capacitor C3. This signal from there is coupled by way of a further filter that provides for low end roll-off. This comprises resistor R5 and capacitor C4. The signal from this filter circuit couples to operational amplifier A2 that has associated therewith capacitor C5 and resistor R6 for providing some high end roll-off. It is noted that at the output of the amplifier A2 there is taken a sense line 15 the use of which will be described in detail hereinafter.

The output from the distortion amplifier A2 couples by way of resistor R7 to light emitting diodes D1 and D2. It is actually the diodes D1 and D2 that provide the clipping to cause the distortion. These diode also at the same time provide visual indication of clipping.

As indicated previously, one of the controls in accordance with the present invention occurs by virtue of sensing when the audio is coming out of a partial distortion mode of operation. This occurs in the "edge" mode of operation of the system in which the operator then turns the volume control down so as to obtain a more clean signal. The circuit of the present invention is then adapted to sense this transition toward a clean signal and compensate volume-wise. In this regard the circuit includes a gain control amplifier A3 (FIG. 1A) having one input at 16 that receives an output signal from the distortion amplifier A2. This signal is coupled by way of a filter circuit comprised of capacitors C6 and C7 and resistors R8, R9 and R10. Also coupled to the line 16 is a further filter circuit comprised of resistors R11 and R12 along with capacitor C8 as noted in the drawing.

As indicated previously, line 15 is a sensing line. It is noted that this line is not taken directly at the clipping diodes but is preferably taken on the other side of resistor R7 at the direct output of the amplifier A2. In the operation of the circuit the clipping is established across the diodes D1 and D2 first and as one transitions out of distortion a clipped signal may still appear across the diodes while a non-clipped, decreasing peak signal is sensed at line 15. It is preferred to sense at this point in the circuit so as to provide the proper type of control.

In connection with the control of this invention reference is now made to FIG. 2 which shows the RMS voltage transfer function ($V_{IN}$vs.$V_{OUT}$) illustrating a curve that has multiple segments. At low input audio signals along curved segment C1 operation is considered to be in the clean mode of operation. The curve then peaks at point P1 and at least a partial mode of distortion is represented at the curve segments C2 and C3. It is readily noted in FIG. 2 that once the peak P1 is reached then additional increases in input audio cause a decrease in the output signal as illustrated at the curve segment C2.

In the voltage waveform the preferred area of operation is illustrated at C4. It is noted that in that area of operation any decrease in the input signal is accompanied by a decrease in volume output. It is the sensing circuit of the present invention that causes the RMS level at curve C3 to be lower than that of curve C4. This circuitry includes, not only the gain control amplifier A3 but also the circuit commencing from the feedback line 15 by way of components to be describe hereinafter to the field effect transistor Q1 (see FIG. 1A).

It is noted that the amplifier A3 has associated therewith a resistor R21 coupled between the feedback input and the output of the amplifier A3. The resistor R21 in part determines the gain of the amplifier. The gain is also controlled by a series resistance path including the electronic switch SW2, resistor R17 and the resistance of the field effect transistor Q1. In this connection the capacitor C10 in this feedback loop is simply a DC blocking capacitor. The input signal to the electronic switch SW2 from the resistor R20 controls the switch so that either the resistor R17 along with resistor R18 are coupled to the capacitor, or the resistor R19 is coupled to the capacitor C10. When the auto clean function is operating then the resistors R17 and R18 are coupled to the capacitor C10. In other modes of operation the resistor R19 is coupled to the capacitor C10 so as to provide a fixed gain for the amplifier A3. The auto clean function of the present invention only operates when auto clean operation has been selected and when in the "edge" or partial distortion mode of operation.

The sensing signal taken at the direct output of the amplifier A2 at line 15 couples by way of resister R13 to resistor R14 and from there to the peak detector circuit which is comprised of diode D3 and capacitor C9. The signal is then coupled by way of resistor R15 to the gate electrode of the field effect transistor Q1. The resistor R16 couples between the drain and gate electrodes of the transistor Q1. The drain electrode of transistor Q1 also couples by way of resistor R17 to the electronic switch SW2. The resistor R18 couples in parallel with the resistor R17 and the transistor Q1.

Now, when operation is at a point just above (louder) where one is transitioning from partial distortion to a clean signal it may be assumed that amplifier A2 is clipping the signal and therefor the signal on line 15 is at its maximum value. The peak detector comprised of capacitor C9 and diode D3 detects the negative peaks by virtue of placement of the diode D3 and thus there is a maximum negative signal that is coupled to the field effect transistor Q1. The field effect transistor Q1 is one in which it assumes its low impedance state when there is a ground on both the gate and source electrodes. However, when the electrode is negative then the resistance of the transistor Q1 is at a higher impedance. The resistor values (resistor R14 in combination with resistor R13) are selected so that at this maximum negative voltage the gain of the amplifier A3 is about equivalent to the gain used when not in the auto clean mode of operation. In this regard the gain of the amplifier A3, as indicated previously, is determined by the resistor R21 but more importantly the resistance to ground which is varied by the field effect transistor Q1.

Now, as the volume is turned down so that the output of the amplifier A2 has a decreasing signal, the output of the peak detector which is the voltage across capacitor C9 becomes less negative and approaches ground. When this occurs the impedance of the field effect transistor Q1 decreases as the transistor becomes more conductive. This means that the resistance determining the gain also decreases causing the gain to correspondingly increase. The gain that we refer to is the gain of the amplifier A3. Thus, in summary, as the volume is turned down the operation of the transistor Q1 causes the gain of amplifier A3 to increase. This signal is coupled by way of a network that is adapted to adjust the frequency response of the output signal. This network includes capacitors C11 and C12 along with resistors R22-R26.

In the circuitry associated with the field effect transistor Q1, it is noted that the resistors R15 and R16 are in particular employed in the configuration illustrated so as to decrease the transistor distortion. The resistor R18 adds stablization to the circuit.

As indicated previously, the automatic circuit of the present invention also senses the decrease in volume when transitioning from partial distortion to a clean signal so as to control frequency content and in particular to boost the high end signals particularly at low volume settings. In this regard refer to the circuits previously described at the input to the distortion amplifier A2 (see FIG. 1A). These include the filters comprised of capacitor C2 and resistor R3 and also the filter comprised of capacitor C3 and resistor R4.

Figure 1B:
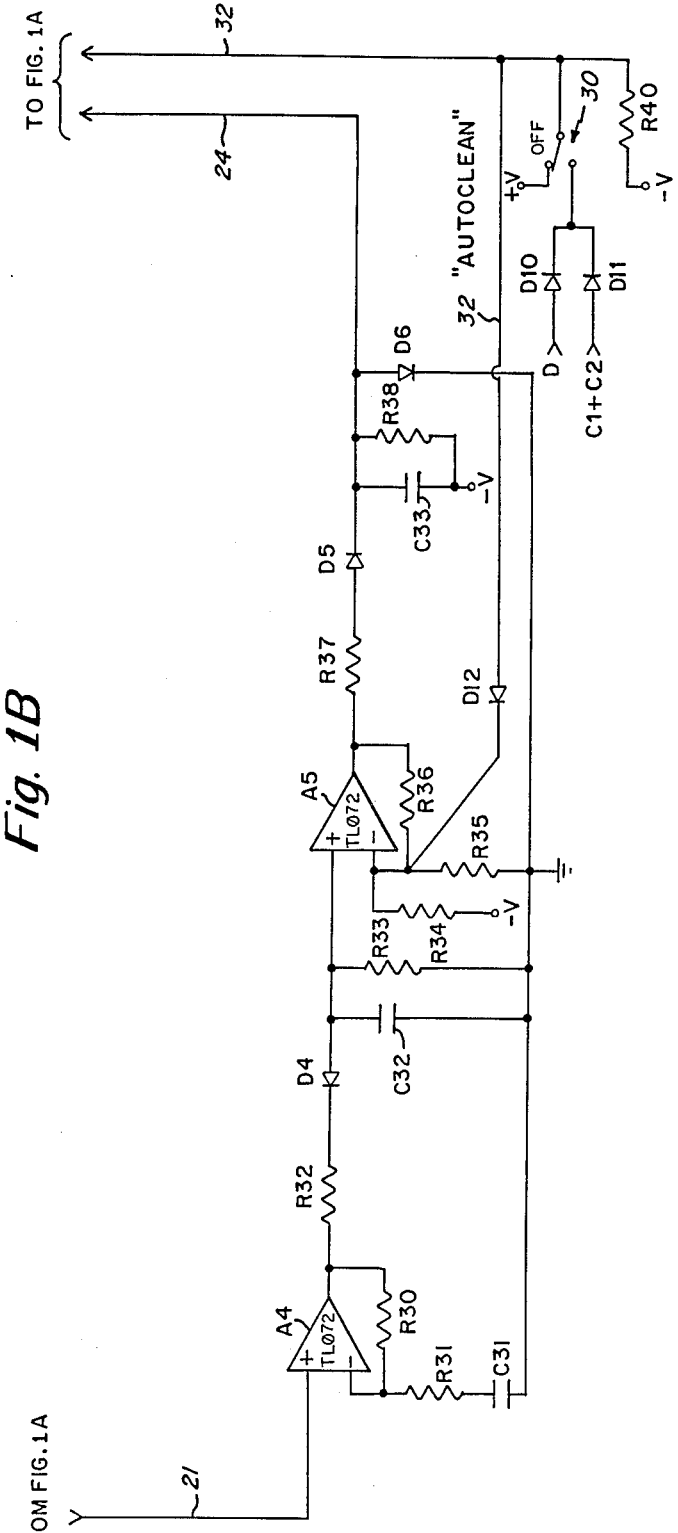

With regard to the maintenance of proper treble when decreasing the volume knob the sensing occurs very close to the input of the circuit at node 12 wherein it is noted there is provided an output sensing line 21 that couples to the assertion input of amplifier A4 illustrated in FIG. 1B. The amplifier A4 has associated therewith a gain control resistor R30 and a filter circuit comprised of resistor R31 and capacitor C31. This filter circuit provides low end roll-off. The output of the amplifier couples by way of resistor R32 to a peak detector that is comprised of diode D4 and capacitor C32. There is also a further resistor R33 in parallel with capacitor C32.

The output of the peak detector circuit couples to a comparator A5. The signal from the peak detector couples to the negation input of the comparator A5. A resistor divider network is coupled at the assertion input of the comparator A5. This network includes resistor R34, resistor R35 and a further resistor R36.

The output from the comparator A5 couples to a resistor R37 and from there to diode D5 and capacitor C33. A resistor R38 is in parallel with capacitor C33. A further diode D6 is coupled from ground to the line 24. The diode D6 protects the field effect transistors that are associated with the filter circuits at the input to the distortion amplifier, all to be described in further detail hereinafter.

The drawing also illustrates the auto clean switch at 30. In the particular position illustrated there the switch is off. The fixed contact of the switch couples to line 32 which actually branches in two directions. The moveable contacts of the switch 30 couple either to a positive voltage for an "off" condition or couples to an OR circuit including diodes D10 and D11. The diode D10 receives the distortion signal while the Diode D11 receives the clean signal. These signal are typically at a positive voltage on the order of +8 volts when in those particular modes of operation, and at a voltage on the order of −8 volts when not in those modes of operation. As has been indicated, the automatic clean feature of the present invention only operates when in the "edge" mode of operation which is a partial distortion mode of operation. The full distortion mode of operation is coupled to the diode D10. Therefore, when in the "edge" mode of operation the diodes D10 and D11 are both reverse biased and if the switch 30 is in its auto clean mode of operation with the moveable contact in its lower position, then the line 32 is at a negative voltage because of the negative voltage coupled via the resistor R40. This negative voltage coupled by way of the resistor R20 assures that the electronic switch SW2 couples signals from resistor R17 to the amplifier A3. Similarly, the negative signal on the other part of line 32 couples to the diode D12 maintaining the diode reverse biased and thus essentially enabling the comparator A5 to operate.

When one is not in the "edge" mode of operation then one or the other of the diodes D10 and D11 are forward biased causing the line 32 to be at a positive voltage level. This same operation also occurs when the switch 30 is moved to the position shown in the drawing in which the line 32 is also maintained at a positive voltage. This positive voltage coupled by way of resistor R20 switches the electronic switch SW2 so that the field effect transistor is now out of the circuit and resistor R19 controls the gain of the amplifier A3. Also, the positive voltage on line 32 coupling to diode D12 causes the diode 12 to be forward-biased causing a relatively large positive voltage on the order of about 7 volts to appear at the comparator A5. This means that there is a high voltage output from the comparator A5 clamped by the diode D6 but causing operation of the filters at the input of the distortion amplifier to maintain these filters in the circuit. Thus, when not in the automatic clean mode of operation the filtering at the input to the distortion amplifier operates in the normal manner without any feedback controlling as sensed at line 21.

Once again, when in the auto clean mode of operation and also in the "edge" mode of operation the signal at line 32 is negative permitting the auto clean feedback to operate. As the volume control knob is turned down but is still at a relatively high level the signal on line 21 is of high amplitude and this signal is coupled by way of resistor R32 to the peak detector. The peak detector comprised of diode D4 and capacitor C32 detects the negative excursion of the signal providing a sufficient negative input to the negation side of the comparator A5 so that the output thereof is positive. This output is controlled by diode D6 so that it does not exceed +0.6 volts. This signal couples by way of line 24 (intercoupling between FIGS. 1A and 1B) and resistor R41 to the field effect transistors associated with the input filtering. These include the transistors Q2, Q3 and Q4. The transistor Q2 couples from ground to the resistor R1 associated with a low end roll-off filter. The transistor Q3 couples from ground to the resistor R3 which is part of one of the high end roll-off filters. The transistor Q4 also couples from ground to the capacitor C3 which is also a high end roll-off filter.

Now, when the volume is being decreased but still is at a relatively high value the positive signal on line 24 causes the field effect transistors to be in their "on" state thus maintaining the filter circuits at the input to the distortion amplifier in the circuit.

As the volume is decreased further, the output of the peak detector also decreases or becomes less negative. Now, it is noted that a voltage divider is provided between resistors R34 and R35 establishing a negative voltage at the assertion input to the comparator A5. When the decreasing voltage at the negation input to the comparator A5 reaches the voltage at the other input then the comparator A5 triggers and the output thereof becomes negative. This negative signal is coupled by way of resistor R37 and diode D5 to the control line 24. This negative signal holds the field effect transistors Q2-Q4 at a high impedance state so that the associated filters are essentially out of the circuit.

Therefore, at higher volumes the roll-off of high frequency occurs but in order to maintain sufficient treble, in this auto clean mode of operation it is desired to maintain sufficient high end as the volume decreases. This occurs by virtue of simply not rolling off the high ends as the volume decreases. The high end signals are not rolled off by virtue of eliminating these roll-off filters.

It is noted that the field effect transistor Q2 actually controls a low end roll-off filter and it has been found that it is desired when the volume decreases to not only boost high end frequencies but also to boost slightly the low end frequencies.

Thus, in accordance with the invention the referred to boosting of high end or low end at low volume actually occurs by simply not permitting roll-off filters to operate under those parameters.

In connection with the circuit that is described in FIGS. 1A and 1B, reference is now made to a table of component values and types associated with this circuit.

| COMPONENT | VALUE OR TYPE |
| --- | --- |
| R1 | 220K |
| R2 | 180K |
| R3 | 56K |
| R4 | 3.9K |
| R5 | 27K |
| R6 | 4.7K |
| R7 | 1.0K |
| R8 | 10K |
| R9 | 13K |
| R10 | .82K |
| R11 | 139K |
| R12 | 120K |
| R13 | 390 r |
| R14 | 1K |
| R15 | 10 Meg |
| R16 | 8.2 |
| R17 | 1.2K |
| R18 | 12K |
| R19 | 4.7K |
| R20 | 1.0K |
| R21 | 9.3K |
| R22 | 10K |
| R23 | 1.2K |
| R24 | 390 r |
| R25 | 27K |
| R26 | 15K |
| R27 | 7.5K |
| R30 | 39K |
| R31 | 10K |
| R32 | 390 r |
| R33 | 470K |
| R34 | 56K |
| R35 | 6.8K |
| R36 | 1.0 M |
| R37 | 390 r |
| R38 | 22 M |
| R40 | 10K |
| R41 | 22 M |
| C1 | .047 uf |
| C2 | 560 pf |
| C3 | .027 uf |
| C4 | .0088 uf |
| C5 | 22 pf |
| C6 | .022 uf |
| C7 | .027 uf |
| C8 | .010 uf |
| C9 | .10 uf |
| C10 | 10 uf |
| C11 | .047 uf |
| C12 | .082 uf |
| C13 | .0039 uf |
| C31 | .033 uf |
| C32 | .22 uf |
| C33 | .033 uf |
| D1 | CR286 |
| D2 | CR287 |
| D3 | CR12 |

-continued

| COMPONENT | VALUE OR TYPE |
| --- | --- |
| D4 | CR13 |
| D5 | CR14 |
| D6 | CR15 |
| D10 | CR16 |
| D11 | CR17 |
| D12 | CR18 |

Having now described the limited number of embodiments of the present invention, it should now be apparent to those skilled in the art that numerous other embodiments and modifications thereof are contemplated as falling within the scope of the present invention as defined by the appended claims.

What is claimed is:

1. An audio processing circuit for controlling high frequency audio signal content comprising;
an input terminal for receiving an input audio signal, distortion means coupled from said input terminal,
volume control means controlling the signal level to the input terminal,
gain control means coupled from said distortion means and having an output, said gain control means for providing an at least partially distorted audio signal including means for sensing the level of the audio signal coupled via said distortion means to control gain so as to increase output signal gain as the volume control means is decreased in volume,
and circuit means for automatically and continuously sensing the level of said input audio signal to boost high frequency audio signal content as the volume control means is decreased in volume so as to maintain high frequency audio signal content at lower volume.

2. An audio processing circuit as set forth in claim 1 wherein said distortion means includes a distortion amplifier, a clipping means and means intercoupling the output of the amplifier with the clipping means.

3. An audio processing circuit as set forth in claim 2, wherein said gain control means comprises a gain control amplifier having a pair of inputs, one input receiving a signal from said clipping means.

4. An audio processing circuit as set forth in claim 3 wherein said circuit means for sensing the level of the audio signal to control gain includes a feedforward circuit coupled from the output of the distortion amplifier to the second input of the gain control amplifier.

5. An audio processing circuit as set forth in claim 4 wherein said feedforward circuit means includes a peak detector and a variable impedance semi-conductor device.

6. An audio processing circuit as set forth in claim 5 wherein said variable impedance semi-conductor device comprises a field effect transistor.

7. An audio processing circuit as set forth in claim 5 wherein the gain of the gain control amplifier is determined by a first resistor across the amplifier and at least a second resistor in series between the amplifier and the field effect transistor.

8. An audio processing circuit as set forth in claim 1 further including filter means coupled between said input terminal and said means for providing an at least partially distorted audio signal.

9. An audio processing circuit as set forth in claim 8 wherein said filter means comprises a plurality of filter means with at least one filter for providing high end roll-off.

10. An audio processing circuit as set forth in claim 9 wherein said circuit means for sensing an audio signal level to boost high frequency audio signal content comprises means for sensing an audio signal including means for sensing a decrease in signal level to inhibit said at least one high end roll-off filter.

11. An audio processing circuit as set forth in claim 10 wherein said filter means each have in series therewith a semi-conductor control device for enabling or alternately inhibiting each filter.

12. An audio processing circuit as set forth in claim 11 wherein said circuit means for sensing audio signal level includes an amplifier, a peak detector coupled from the amplifier and a comparator, the output of said comparator coupling to control said semi-conductor control devices.

13. An audio processing circuit as set forth in claim 12 wherein said comparator triggers upon the volume being decreased to a predetermined threshold so as to turn off the semi-conductor control devices to render the associated filters inoperative thereby boosting high frequency signal content.

14. An audio processing circuit as set forth in claim 13 wherein the semi-conductor control devices each comprise a field effect transistor.

15. An audio processing circuit as set for the in claim 14 wherein said filter means also includes a low end roll-off filter and associated field effect transistor also controlled from said comparator.

16. An audio processing circuit as set forth in claim 1 wherein said gain control means comprises a gain control amplifier having a pair of inputs and a clipping means, said gain control amplifier including one input for receiving a signal from said clipping means.

17. An audio processing circuit as set forth in claim 1 further including filter means coupled between said input terminal and said distortion means.

18. An audio processing circuit as set forth in claim 17 wherein said filter means has a filter control input for controlling the frequency response of the filter.

19. An audio processing circuit as set forth in claim 18 wherein said circuit means couples from said input terminal to said filter control input to provide for said boost in high frequency signal content.

20. An audio processing circuit as set forth in claim 19 wherein said circuit means includes means for sensing a decrease in signal level to inhibit said filter means.

21. An audio processing circuit as set forth in claim 20 wherein said filter means comprises a high frequency roll-off filter.

22. An audio processing circuit as set forth in claim 21 wherein the signal to the filter control input inhibits the filter at low signal levels so as to eliminate high end roll-off and thus increase treble signal content at reduced input volume.

23. An audio processing circuit for controlling high frequency audio signal content comprising;
an input audio circuit for receiving an input audio signal at an input terminal and including a volume control means for controlling the signal level through said input audio circuit,
distortion means,
means coupling the input audio circuit to said distortion means,
gain control means,
means coupling the distortion means to said gain control means,
said gain control means providing an increase in signal level therethrough as the volume control means is decreased in volume,
and circuit means for automatically and continuously sensing input audio signal level to boost high frequency audio signal content as the volume control means is decreased in volume so as to maintain high frequency audio signal content at lower volume.

24. An audio processing circuit as set forth in claim 23 wherein said gain control means comprises a gain control amplifier having a first gain control input and a second input coupled from said distortion means.

25. An audio processing circuit as set forth in claim 24 wherein said distortion means includes a distortion amplifier and a clipping circuit, the distortion amplifier coupling to the clipping circuit and also coupling via a gain control feedback circuit to said first gain control input of the gain control amplifier.

26. An audio processing circuit as set forth in claim 25 including a resistor coupled between the distortion amplifier and clipping circuit, the node between the resistor and clipping circuit coupling to said gain control amplifier.

27. An audio processing circuit as set forth in claim 23 wherein said input audio circuit includes a filter means having a filter control input for controlling the frequency response of the filter.

28. An audio processing circuit as set forth in claim 27 wherein said circuit means couples from said input terminal to said filter control input to provide for said boost in high frequency signal content.

29. An audio processing circuit as set forth in claim 28 wherein said circuit means is for sensing a decrease in signal level to inhibit said filter means.

30. An audio processing circuit as set forth in claim 29 wherein said filter means comprises a high frequency roll-off filter.

31. An audio processing circuit as set forth in claim 30 wherein the signal to the filter control input inhibits the filter at low signal levels so as to eliminate high end roll-off and thus increase treble signal content at reduced input volume.

32. An audio processing circuit as set forth in claim 23 wherein said gain control means has at least two states of operation and further including switch means, in one state providing a constant gain and in another state providing variable gain control in accordance with said volume control means.

33. An audio processing circuit as set forth in claim 32 further including mode select means for establishing distortion, clear and partial distortion modes, said switch means responsive to said modes to enable said variable gain control only in said partial distortion mode.

34. A method of processing an audio signal to control the high frequency content of the audio signal as the volume of the signal varies, comprising the steps of distorting the input audio signal, automatically controlling the gain of the distorted audio signal to maintain the amplitude of the audio signal even as the volume of the audio signal is decreased, and automatically and continuously sensing input audio signal level to boost high frequency signal content as the audio signal decreases in volume so as to maintain high frequency signal content at lower volume.

35. A method as set forth in claim 34 further including the step of filtering the input audio signal to provide high end roll-off and including controlling the filtering to eliminate high end roll-off and thus increase treble signal content at reduced input volume.

* * * * *